United States Patent
Lee et al.

(10) Patent No.: US 12,233,622 B2
(45) Date of Patent: Feb. 25, 2025

(54) ELECTROMAGNETIC INTERFERENCE SHIELDING FILM AND PREPARING METHODS THEREOF

(71) Applicant: ASIA ELECTRONIC MATERIAL CO., LTD., Hsin-Chu County (TW)

(72) Inventors: Wei-Chih Lee, Hsin-Chu County (TW); Chih-Ming Lin, Hsin-Chu County (TW); Chia-Hua Ho, Hsin-Chu County (TW); Chien-Hui Lee, Hsin-Chu County (TW)

(73) Assignee: ASIA ELECTRONIC MATERIAL CO., LTD., Hsin-Chu County (TW)

( * ) Notice: Subject to any disclaimer, the term of this patent is extended or adjusted under 35 U.S.C. 154(b) by 0 days.

(21) Appl. No.: 17/898,679

(22) Filed: Aug. 30, 2022

(65) Prior Publication Data
US 2023/0065194 A1 Mar. 2, 2023

(30) Foreign Application Priority Data
Aug. 30, 2021 (TW) .................. 110132089

(51) Int. Cl.
*B32B 15/08* (2006.01)
*B32B 7/12* (2006.01)
(Continued)

(52) U.S. Cl.
CPC ............... *B32B 15/08* (2013.01); *B32B 7/12* (2013.01); *B32B 15/20* (2013.01); *B32B 27/18* (2013.01); *B32B 27/281* (2013.01); *B32B 37/12* (2013.01); *B32B 37/182* (2013.01); *H05K 9/0088* (2013.01); *B32B 2264/1022* (2020.08); *B32B 2264/108* (2013.01); *B32B 2305/026* (2013.01); *B32B 2307/206* (2013.01);
(Continued)

(58) Field of Classification Search
CPC ........ B32B 2255/062; B32B 2307/212; B32B 2307/4026; B32B 2307/536; B32B 7/12; B32B 15/08; B32B 15/20; H05K 9/0088; H05K 9/0081; H05K 9/0086
See application file for complete search history.

(56) References Cited

U.S. PATENT DOCUMENTS

2019/0217582 A1* 7/2019 Son .................... B32B 7/022
2019/0246528 A1* 8/2019 Cui ...................... H05K 9/0084

FOREIGN PATENT DOCUMENTS

CN 106659108 A * 5/2017
CN 110012655 A * 7/2019 ............... C09J 7/29
(Continued)

*Primary Examiner* — Alicia J Weydemeyer
(74) *Attorney, Agent, or Firm* — Amin, Turocy & Watson, LLP

(57) ABSTRACT

An electromagnetic interference shielding film includes an insulation layer, a first adhesive layer, a porous metal layer and a conductive adhesive layer including a plurality of conductive particles. The first adhesive layer is located between the insulation layer and the porous metal layer, and the porous metal layer is formed on the first adhesive layer, and making the first adhesive layer locate between the porous metal layer and the insulation layer. The conductive adhesive layer is located on the porous metal layer so that the porous metal layer is located between the first adhesive layer and the conductive adhesive layer. The present invention further provides a preparation method thereof.

11 Claims, 1 Drawing Sheet

(51) Int. Cl.
*B32B 15/20* (2006.01)
*B32B 27/18* (2006.01)
*B32B 27/28* (2006.01)
*B32B 37/12* (2006.01)
*B32B 37/18* (2006.01)
*H05K 9/00* (2006.01)

(52) U.S. Cl.
CPC . *B32B 2307/212* (2013.01); *B32B 2307/4026* (2013.01); *B32B 2307/406* (2013.01); *B32B 2307/536* (2013.01); *B32B 2307/538* (2013.01); *B32B 2307/732* (2013.01); *B32B 2307/748* (2013.01); *B32B 2311/04* (2013.01); *B32B 2311/08* (2013.01); *B32B 2311/12* (2013.01); *B32B 2311/14* (2013.01); *B32B 2311/16* (2013.01); *B32B 2311/22* (2013.01); *B32B 2311/24* (2013.01); *B32B 2311/30* (2013.01); *B32B 2367/00* (2013.01); *B32B 2379/08* (2013.01); *B32B 2457/00* (2013.01)

(56) References Cited

FOREIGN PATENT DOCUMENTS

| | | | | | |
|---|---|---|---|---|---|
| CN | 112437598 | A | * | 3/2021 | ........... H05K 9/0081 |
| CN | 216391960 | U | * | 4/2022 | |
| JP | 2015111669 | A | * | 6/2015 | |

* cited by examiner

ELECTROMAGNETIC INTERFERENCE SHIELDING FILM AND PREPARING METHODS THEREOF

TECHNICAL FIELD

The present invention relates to an electromagnetic interference shielding film, in particular to an electromagnetic interference shielding film including a porous metal layer for use with a carrier layer.

BACKGROUND

Under the market demand that electronic and communication products tend to be multi-functional and complex, the structure of a circuit board needs to be lighter, thinner and smaller, and in terms of function, it needs powerful and high-speed signal transmission. As the electronic signal transmission is more high-speed and denser, the circuit density is bound to increase, resulting in that the distance between the substrate circuits is closer. And, the application frequency is moving towards a high broadband, which makes the electromagnetic interference (EMI) situation more and more serious. So, it must be effectively managed Electromagnetic Compatibility (EMC) for maintenance of the normal signal transmission of electronic products and improvement of reliability. The thin and flexible characteristics make a flexible printed circuit (FPC) to plays an important role in moving toward the demand for portable information and in the development of the communication electronics industry.

Due to the trend of smaller and smaller electronic communication products, it drives the flexible board must have more and powerful functions. On the other hand, due to the trend of miniaturization of portable electronic products, it also drives the high demand for high-density FPC technology, which requires powerful function and is applicable to high-frequency, high-density, and fine-pitch conditions. Currently, shielding films for thin-film FPCs have been introduced, and been widely used in small electronic products such as cell phones, digital cameras, and digital video cameras.

Based on the needs of product appearance and surface protection, the electromagnetic interference shielding film relies on the design of black polyimide film. Most of the polyimide films on the market are made by the casting process, but the dimensional stability of the film in the uniaxial extension method cannot meet the needs of the industry and thus the biaxial stretching method needs to be used, thereby leading to an increase of the difficulty and requirements of the equipment and the process. In accordance with the design of thin and light electronic products and in order to reduce the thickness requirements of the flexible board material in the back-end FPC multilayer board process, a thinning thickness of 5 to 7.5 microns is usually required. However, at this extremely thin thickness, it is difficult to achieve the currently required low-gloss surface (i.e., gloss less than 25 GU), and general properties such as mechanical strength, processing operability, and bendability cannot reach the current industry standards. At the same time, it has the problem of poor yield.

In order to solve the above-mentioned problem of the thin polyimide film, usually, an epoxy resin or polyurethane ink layer with a release film is used together to obtain an insulating layer with a thinner thickness and a low-gloss surface. However, the properties of the ink layer including mechanical strength, insulation property, hardness, chemical resistance, and heat resistance are generally inferior to those of the black polyimide film. In addition, the release agent in the release film contains organosilicon to provide sufficient release force but the surface in contact with the release film may present residual organosilicon after peeling off the release film, resulting in a decrease in the reliability of the subsequent electroplating process.

In addition, as the demand for EMI shielding performance is getting higher and higher, the thickness of the metal layer in the EMI shielding film is also getting higher and higher, however, its disadvantages also appear as the thickness increases. Problems of solder heat resistance of the electromagnetic interference shielding film and in surface mount technology (SMT) process test are particularly obvious. For example, a large-area popcorn effect occurs in an immersion tin test after a curing process under normal conditions; a large-area popcorn effect occurs in a shielding film process after SMT process or the on-resistance in a circuit increases significantly in SMT process; and the weatherability problem is caused when a thicker shielding metal layer is used in combination with a thinner insulating layer and conductive adhesive layer. For example, under high temperature and high humidity environments or thermal shock test conditions, the on-resistance will increase significantly and the adhesion force will decrease, and even the delamination of a shielding metal layer will occur.

SUMMARY

In order to solve the above problem, the invention provides an electromagnetic interference shielding film comprising an insulation layer with pencil hardness of 2H to 6H, which includes a pigment, an inorganic additive or a combination thereof; a first adhesive layer formed on the insulation layer; a porous metal layer having a plurality of micropores with a diameter of 1 to 120 microns, which is formed on the first adhesive layer, allowing the first adhesive layer to be located between the porous metal layer and the insulation layer, wherein a porosity of the porous metal layer is 15% to 30%, a tensile strength of the porous metal layer is equal to or greater than 20 kgf/mm$^2$, and an elongation of the porous metal layer is equal to or greater than 5%; and a conductive adhesive layer with a plurality of conductive particles, which is formed on the porous metal layer, allowing the porous metal layer to be located between the first adhesive layer and the conductive adhesive layer.

In one embodiment of the electromagnetic interference shielding film according to the present invention, the electromagnetic interference shielding film further comprises a carrier layer formed on the insulation layer, so that the insulation layer is located between the carrier layer and the first adhesive layer, and the carrier layer has a surface roughness Rz of 0.001 to 10 microns.

In one embodiment of the electromagnetic interference shielding film according to the present invention, the carrier layer includes at least one inorganic additive selected from the group consisting of calcium sulfate, carbon black, silicon dioxide, titanium dioxide, zinc sulfide, zirconium oxide, calcium carbonate, silicon carbide, boron nitride, aluminum oxide, talcum powder, aluminum nitride, glass powder, quartz powder, and clay.

In one embodiment of the electromagnetic interference shielding film according to the present invention, the pigment includes an inorganic pigment, an organic pigment, or a combination thereof.

In one embodiment of the electromagnetic interference shielding film according to the present invention, the inorganic additive is at least one selected from the group consisting of calcium sulfate, carbon black, silicon dioxide, titanium dioxide, zinc sulfide, zirconium oxide, calcium carbonate, silicon carbide, boron nitride, aluminum hydroxide, aluminum oxide, talcum powder, aluminum nitride, glass powder, quartz powder, and clay.

In one embodiment of the electromagnetic interference shielding film according to the present invention, the electromagnetic interference shielding film further comprises a second adhesive layer located between the porous metal layer and the conductive adhesive layer.

In one embodiment of the electromagnetic interference shielding film according to the present invention, the insulation layer includes polyimide resin.

In one embodiment of the electromagnetic interference shielding film according to the present invention, after the carrier layer is separated from the electromagnetic interference shielding film, the contact surface of the insulation layer in contact with the carrier layer has a gloss of 0 to 40 GU at a test angle of 60 degrees.

In one embodiment of the electromagnetic interference shielding film according to the present invention, the material for forming the porous metal layer is copper, aluminum, lead, nickel, cobalt, tin, silver, iron, or gold.

In one embodiment of the electromagnetic interference shielding film according to the present invention, the material of the plurality of conductive particles is at least one selected from the group consisting of copper, silver, nickel, tin, gold, palladium, aluminum, chromium, titanium, zinc, carbon, and alloys thereof.

In one embodiment of the electromagnetic interference shielding film according to the present invention, the thickness of the insulation layer is 3 to 10 microns, the thickness of the first adhesive layer is 3 to 20 microns, the thickness of the porous metal layer is 2 to 15 microns, and the thickness of the conductive adhesive layer is 3 to 25 microns.

The present invention further provides a preparation method of an electromagnetic interference shielding film, which comprises: forming a first adhesive layer on the surface of a porous metal layer; contacting the first adhesive layer with the insulation layer, and laminating the porous metal layer and the insulation layer, allowing the first adhesive layer to be located between the insulation layer and the porous metal layer; and forming a conductive adhesive layer on the surface of the porous metal layer, allowing the porous metal layer to be located between the first adhesive layer and the conductive adhesive layer.

In one embodiment of the preparation method according to the present invention, the preparation method of the porous metal layer comprises: forming an aluminum layer on a thin film; performing a release treatment on the surface of the aluminum layer; plating a metal layer on the surface of the aluminum layer subjected to the release treatment, wherein the plating method is one selected from sputtering, deposition, and water plating, and forming holes in the metal layer by micro-etching; and peeling off the film and aluminum layer, so that the metal layer is formed as a porous metal layer.

In one embodiment of the preparation method according to the present invention, the thin film is polyimide or ethylene terephthalate, and the metal layer is copper, aluminum, lead, nickel, cobalt, tin, silver, iron, or gold.

In one embodiment of the preparation method according to the present invention, the preparation method further comprises forming a second adhesive layer on the porous metal layer before forming the conductive adhesive layer, and then forming the conductive adhesive layer on the second adhesive layer.

In one embodiment of the preparation method according to the present invention, the preparation method further comprises forming the insulation layer on a surface of a carrier layer before forming the first adhesive layer on the surface of the porous metal layer, and then contacting the first adhesive layer with the insulation layer and laminating the porous metal layer and the carrier layer to make the insulation layer locate between the carrier layer and the first adhesive layer.

The electromagnetic interference shielding film of the present invention has many advantages such as good surface insulation, high surface hardness, good chemical resistance, high heat resistance, high shielding performance, high adhesive strength, good operability, low transmission loss, high transmission quality and good product reliability, and has a low gloss (matte) appearance at the same time, which is in line with the needs of back-end application.

In addition, the electromagnetic interference shielding film of the present invention uses a porous metal layer to replace the metal layer used in the current shielding film, and the porous metal layer can reflect electromagnetic waves, so that it can reflect most energy of the radio frequency and microwave. The transmission component is extremely small, so as to effectively shield the interference of electromagnetic wave radiation and eliminate the contamination from electromagnetic radiation. Furthermore, the porous metal layer can significantly improve the overall solder resistance of the shielding film, which is beneficial for the reflow soldering process of the back-end products, for example, the solder heat resistance of more than 300° C. can be achieved.

On the other hand, in the electromagnetic interference shielding film of the present invention, the carrier layer is used in combination with the insulation layer, and the surface roughness and surface energy of the carrier layer and the insulation layer are changed by means of additives in the composition or surface treatments, so it can have sufficient release force without using a release film (i.e., no need to add release agents), thus not causing the problem of organosilicon transfer.

Further, the insulation layer used in the electromagnetic interference shielding film of the present invention is made of polyimide varnish, which has a better surface insulation property than the ink-type insulation layer such as epoxy resin or polyurethane resin. The insulation resistance value can reach more than $10^{12}\Omega$, and it has better impedance control ability, chemical resistance, solder resistance, and surface hardness. In addition, compared with the thin black polyimide film (for example, 5 to 7.5 microns) that requires an additional carrier film during process, the preparation method of the electromagnetic interference shielding film of the present invention is simpler and lower in cost, and it can achieve the effect of thin thickness and low surface gloss (for example, less than 40 GU) at the same time.

BRIEF DESCRIPTION OF THE DRAWINGS

Embodiments of the present invention are described with reference to the accompanying figures.

DETAILED DESCRIPTION OF THE EMBODIMENTS

Figure 1:
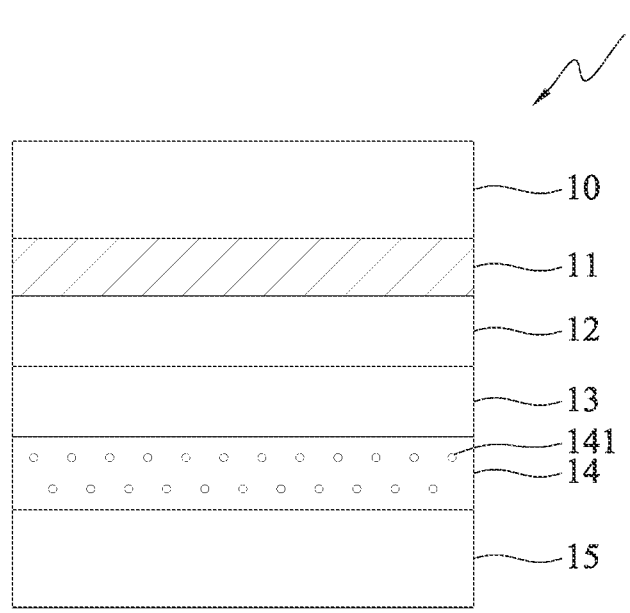
FIG. 1 is a schematic structural diagram of an EMI shielding film of the present invention.

The following describes the implementation of the present invention by means of embodiments, a person of ordinary skills in the art can easily understand the advantages and effects of the present invention from the contents disclosed in this specification.

It should be noted that the structures, proportions, sizes, etc. shown in the drawings attached in this specification are only used to cooperate with the contents disclosed in the specification for the understanding and reading of a person of ordinary skills in the art, and are not intended to limit the conditions under which the present invention can be implemented, and therefore have no technical substantial significance, any modification of the structure, change of the proportional relationship or the adjustment of the size should still fall within the scope that the technical content disclosed in the present invention can cover without affecting the effect that the present invention can produce and the purpose that can be achieved. At the same time, references such as "a", "below" and "above" in this specification are only for the convenience of description, and are not intended to limit the scope of implementation of the present invention. Changes or adjustments to their relative relationships, without substantial changes to the technical content, should also be regarded as the scope of the present invention. Furthermore, all ranges and values herein are inclusive and combinable. Any value or point falling within the range described herein, such as any integer, can be taken as a minimum or maximum to derive lower ranges, etc.

Referring to FIG. 1, which shows an embodiment of the electromagnetic interference shielding film 1 of the present invention, which includes: a carrier layer 10, an insulation layer 11, a first adhesive layer 12, a porous metal layer 13, a conductive adhesive layer 14 with a plurality of conductive particles 141 and the release layer 15. The insulation layer 11 is formed on the surface of the carrier layer 10, the porous metal layer 13 is formed on the surface of the insulation layer 11 through the first adhesive layer 12, the insulation layer 11 is located between the first adhesive layer 12 and the carrier layer 10, the first adhesive layer 12 is located between the insulation layer 11 and the porous metal layer 13. And, the conductive adhesive layer 14 is formed on the surface of the porous metal layer 13, so that the porous metal layer 13 is located between the first adhesive layer 12 and the conductive adhesive layer 14. The conductive adhesive layer 14 has a release layer 15 on the other surface contacting the porous metal layer 13, so that the conductive adhesive 14 is located between the porous metal layer 13 and the release layer 15.

Specifically, the stacking of the electromagnetic interference shielding film 1 shown in FIG. 1 is the carrier layer 10, the insulation layer 11, the first adhesive layer 12, the porous metal layer 13, the conductive adhesive layer 14, and the release layer 15 in order.

In the embodiment, the thickness of the carrier layer is 12.5 to 250 microns, such as 12.5, 20, 30, 40, 50, 60, 70, 80, 90, 100, 110, 120, 130, 140, 150, 160, 170, 180, 190, 200, 210, 220, 230, 240, or 250 microns; the thickness of the insulation layer is 3 to 10 microns, such as 3, 4, 5, 6, 7, 8, 9, or 10 microns; the thickness of the first adhesive layer is 3 to 20 microns, such as 3, 4, 5, 6, 7, 8, 9, 10, 11, 12, 13, 14, 15, 16, 17, 18, 19, or 20 microns; the thickness of the porous metal layer is 2 to 15 microns, such as, 2, 3, 4, 5, 6, 7, 8, 9, 10, 11, 12, 13, 14, or 15 microns; the thickness of the conductive adhesive layer is 3 to 25 microns thick, such as 3, 4, 5, 6, 7, 8, 9, 10, 11, 12, 13, 14, 15, 16, 17, 18, 19, 20, 21, 22, 23, 24, or 25 microns; preferably, the thickness of the first adhesive layer is 3 to 20 microns, the thickness of the porous metal layer is 3 to 8 microns, and the thickness of the conductive adhesive layer is 5 to 15 microns. In another embodiment, the total thickness of the insulation layer and the first adhesive layer is 8 to 25 microns. In still another embodiment, the thickness of the electromagnetic interference shielding film 1 is 11 to 70 microns, such as 11, 15, 20, 25, 30, 35, 40, 45, 50, 55, 60, 65, or 70 microns; preferably, the thickness of the electromagnetic interference shielding film 1 is 14 to 43 microns.

In one embodiment, the carrier layer 10 has a surface roughness Rz of 0.001 to 10 microns, such as 0.001, 0.005, 0.01, 0.05, 0.1, 05, 1, 2, 3, 4, 5, 6, 7, 8, 9, or 10 microns. In one embodiment, the carrier layer 10 has a surface roughness Rz of 0.001 to 2 microns.

In one embodiment, the carrier layer 10 comprises at least one selected from the group consisting of polypropylene (PP), biaxially oriented polypropylene (BOPP), poly-p-xylylene-based resin, polyimide (PI), polyphenylene sulfide (PPS), polyethylene naphthalate (PEN), polyurethane (PU), and polyamide (PA).

In one embodiment, the carrier layer 10 further comprises at least one inorganic additive selected from the group consisting of calcium sulfate, carbon black, silicon dioxide, titanium dioxide, zinc sulfide, zirconium oxide, calcium carbonate, silicon carbide, boron nitride, aluminum oxide, talcum powder, aluminum nitride, glass powder, quartz powder, and clay, and the particle size of the inorganic additives is 10 to 2000 nanometers, such as 10, 50, 100, 150, 200, 250, 300, 350, 400, 450, 500, 550, 600, 650, 700, 750, 800, 850, 900, 950, 1000, 1100, 1200, 1300, 1400, 1500, 1600, 1700, 1800, 1900, or 2000 nm.

By adding the above-mentioned inorganic additives, the carrier layer 10 can have various colors different from the natural material color of the carrier layer, and can improve the gloss and the surface roughness of the carrier layer.

In one embodiment, the insulation layer 11 includes a polyimide resin. In one embodiment, the insulation layer 11 is a polyimide varnish layer. Specifically, the polyimide varnish layer refers to a polyimide resin having an imide bond skeleton. For example but not limited thereto, the polyimide resin is at least one selected from the group consisting of polyimide, polyamide imide, polyester-imides, and polybenzimidazole.

In one embodiment, the insulation layer 11 further includes pigments, and the pigments include inorganic pigments, organic pigments, or combinations thereof. Based on the total weight of the insulation layer 11, the content of the pigments is greater than 0 to 50% by weight. In another embodiment, the inorganic pigment is cadmium red, cadmium tartrazine, cadmium yellow orange, titanium dioxide, carbon black, black iron oxide, or black complex inorganic pigment, and the organic pigment is aniline black, paliogen black, anthraquinone black, benzidine-based yellow pigment, phthalocyanine blue, or phthalocyanine green.

In one embodiment, the insulation layer 11 further comprises at least one inorganic additive selected from the group consisting of calcium sulfate, carbon black, silicon dioxide, titanium dioxide, zinc sulfide, zirconium oxide, calcium carbonate, silicon carbide, boron nitride, aluminum hydroxide, aluminum oxide, talcum powder, aluminum nitride, glass powder, quartz powder, and clay. Based on the total weight of the insulation layer 11, the content of the inorganic additives is greater than 0 to 50% by weight, such as 0.1, 05, 1, 5, 10, 15, 20, 25, 30, 35, 40, 45, or 50% by weight. Preferably, based on the total weight of the insulation layer 11, the content of the inorganic additive is greater than 0 to 20% by weight.

In one embodiment, the insulation layer 11 further includes at least one flame retardant selected from the group consisting of organic additives, halogen-containing compounds, phosphorus-containing compounds, nitrogen-containing compounds, and boron-containing compounds. In another embodiment, based on the total weight of the insulation layer 11, the content of the flame retardant is 1 to 40% by weight, such as 1, 5, 10, 15, 20, 25, 30, 35, or 40% by weight. Preferably, based on the total weight of the insulation layer 11, the content of the flame retardant is 5 to 35% by weight.

In one embodiment, the insulation layer 11 is a plurality of layers, which can further reduce the problem of possible defects on the surface of the insulation layer. For example, but not limited thereto, the insulation layer 11 may be a single-layer polyimide varnish layer containing the aforementioned pigments, inorganic additives, flame retardants, or combinations thereof; or, the insulation layer may be a double-layer polyimide varnish layer, wherein one is a polyimide varnish layer composed of polyimide, and the other is a polyimide varnish layer containing the aforementioned pigments, inorganic additives, flame retardants or combinations thereof. In addition, the insulation layer 11 can also be three, four, five or more layers, which is not limited thereto. Preferably, but not limited to this, in the embodiment in which the insulation layer is a multilayer, the insulation layer containing a relatively high content of additives (i.e., the aforementioned pigments, inorganic additives, flame retardants or combinations thereof) is in contact with the carrier layer to increase the overall shielding and blackness of the electromagnetic interference shielding film, and that can change the surface roughness of the insulation layer to make the carrier layer and the insulation layer easier to separate; and the insulation layer in contact with the first adhesive layer is an insulation layer with a lower content of additives to further improve the overall mechanical properties of the EMI shielding film.

The conventional black insulation layer or polyimide resin only has a pencil hardness of HB to 2H, which is prone to scratches, and thus affects its appearance and mechanical properties. Compared with this, by adding the above-mentioned pigments, inorganic additives, organic additives and/or flame retardants, the insulation layer 11 has improved hardness, which can reach a pencil hardness of 2H to 6H. The insulation layer 11 may have a pencil hardness of 2H, 3H, 4H, 5H or 6H, but not limited thereto. In addition, the flame resistance and hardness of the insulation layer can be adjusted by changing the proportions of inorganic additives, organic additives and/or flame retardants or by changing the components and/or their proportions in the inorganic additives. Specifically, the flame resistance of the insulation layer can be improved by using titanium dioxide, silicon dioxide, aluminum oxide, aluminum hydroxide, calcium carbonate, or mixtures thereof as inorganic additives and increasing the proportion of the above components in inorganic additives, or by increasing the content of flame retardant; he hardness of the insulation layer can be improved by using titanium dioxide, silicon dioxide or their mixtures as inorganic additives, or by increasing the proportion of the above components in inorganic additives. Preferably, inorganic additives including aluminum hydroxide, aluminum oxide, calcium carbonate, or mixtures thereof can improve the flame resistance of the insulation layer.

In one embodiment, after the carrier layer is separated from the electromagnetic interference shielding film, the contact surface of the insulation layer that was originally in contact with the carrier layer has a gloss of 0 to 40 GU at a test angle of 60 degrees, such as 0, 1, 5, 10, 13, 15, 16, 20, 25, 30, 35, or 40 GU. In another embodiment, after the carrier layer is separated from the electromagnetic interference shielding film, the contact surface of the insulation layer that was originally in contact with the carrier layer has a gloss of 0 to 25 GU at a test angle of 60 degrees.

In one embodiment, the first adhesive layer 12 comprises at least one resin selected from the group consisting of epoxy resins, acrylic resins, carbamate-based resins, silicone rubber-based resins, poly-p-xylylene-based resins, bismaleimide-based resins, styrene-ethylene-butylene-styrene block copolymer, polyimide, and polyamide-imide. In this embodiment, based on the total amount of the first adhesive layer, the content of the resin is 40% to 100% by weight, such as 40, 45, 50, 55, 60, 65, 70, 75, 80, 85, 90, 95, or 100% by weight.

In one embodiment, the first adhesive layer 12 further comprises inorganic pigments, organic pigments or combinations thereof. Based on the total weight of the first adhesive layer 12, the content of the pigment (i.e., inorganic pigments, organic pigments or combinations thereof) is greater than 0 to 50% by weight, such as 0.1, 1, 5, 10, 15, 20, 25, 30, 35, 40, 45, or 50% by weight. In addition, the embodiments of the inorganic pigments and organic pigments in the first adhesive layer 12 are the same as the embodiments of the inorganic pigments and organic pigments in the above-mentioned insulation layer 11, and are not be illustrated repeatedly here.

In one embodiment, the first adhesive layer 12 further comprises at least one inorganic additive selected from the group consisting of calcium sulfate, carbon black, silicon dioxide, Teflon®, fluorine resin, titanium dioxide, zinc sulfide, zirconium oxide, calcium carbonate, silicon carbide, boron nitride, aluminum oxide, talcum powder, aluminum nitride, glass powder, quartz powder and clay, and the particle size of the inorganic additives is 10 to 2000 nanometers, such as 10, 50, 100, 150, 200, 250, 300, 350, 400, 450, 500, 550, 600, 650, 700, 750, 800, 850, 900, 950, 1000, 1100, 1200, 1300, 1400, 1500, 1600, 1700, 1800, 1900, or 2000 nm. In another embodiment, based on the total weight of the inorganic additives, the total content of silicon dioxide, carbon black, talc powder, calcium carbonate, glass powder, and quartz powder is greater than 0 to 50% by weight, such as 0.1, 1, 5, 10, 15, 20, 25, 30, 35, 40, 45, or 50% by weight. Preferably, based on the total weight of the inorganic additives, the total content of silicon dioxide, carbon black, talc powder, calcium carbonate, glass powder, and quartz powder is greater than 0 to 20% by weight.

In one embodiment, the first adhesive layer 12 further comprises at least one flame retardant selected from the group consisting of polyimide-based resins, organic powders, and flame-retarding compounds. In one embodiment, the flame-retarding compound is at least one selected from the group consisting of compounds of halogen, phosphorus, nitrogen and boron. In still one embodiment, based on the total weight of the first adhesive layer 12, the content of the flame retardant is 1 to 50% by weight, such as 1, 5, 10, 15, 20, 25, 30, 35, 40, 45, or 50% by weight. Preferably, based on the total weight of the first adhesive layer 12, the content of the flame retardant is 5 to 35% by weight.

In one embodiment, the porous metal layer 13 has micropores with a diameter of 1 to 120 microns, such as 1, 5, 10, 15, 20, 25, 30, 35, 40, 45, 50, 55, 60, 65, 70, 75, 80, 85, 90, 95, 100, 105, 110, 115, or 120 microns; the porous metal layer 13 has a porosity of 15% to 30%, such as 15%, 20%, 25%, or 30%; and the porous metal layer 13 has a tensile strength of equal to or greater than 20 kgf/mm$^2$, such as 20, 25, 30, 35, 40 kgf/mm$^2$ or greater tensile strength. In yet another embodiment, the porous metal layer 13 has an elongation of equal to or greater than 5%, such as an elongation of 5%, 10%, 15%, 20%, 25%, or more.

In one embodiment, the conductive adhesive layer 14 comprises at least one selected from the group consisting of epoxy resins, acrylic resin, phenol-formaldehyde resin, polyurethane, polyimide, and polyamide-imide.

In one embodiment, the plurality of conductive particles 141 is at least one selected from the group consisting of copper, silver, nickel, tin, gold, palladium, aluminum, chromium, titanium, zinc, carbon, and alloys thereof. Preferably, the alloy is at least one selected from the group consisting of nickel-gold alloy, gold-silver alloy, copper-nickel alloy, copper-silver alloy, nickel-silver alloy and copper-nickel-gold alloy. In this embodiment, based on the total weight of the conductive adhesive layer, the plurality of conductive particles 141 have a content of 5 to 55% by weight.

In one embodiment, the release layer is selected from the group consisting of a release film, a release paper, and, a carrier film.

In one embodiment, the release film has a thickness of 25 microns to 100 microns, and the release film is at least one selected from the group consisting of PET fluorine release film, PET silicone oil release film, and PET matte release film, and PE release film. In another embodiment, the release paper has a thickness of 25 microns to 130 microns, and the release paper is PET coated paper. In yet another embodiment, the thickness of the carrier film is 25 microns to 100 microns, and the surface of the carrier film has an adhesive.

The present invention further provides a method for preparing the electromagnetic interference shielding film, which comprises coating the insulation layer 11 on the surface of the carrier layer 10 and curing the insulation layer at a temperature of 50° C. to 180° C., such as 50° C., 60° C., 70° C., 80° C., 90° C., 100° C., 110° C., 120° C., 130° C., 140° C., 150° C., 160° C., 170° C., or 180° C., and coating and curing another insulation layer on the cured insulation layer 11 as needed; coating or transferring the first adhesive layer 12 on the surface of the porous metal layer 13, allowing the first adhesive layer 12 to be in contact with the insulation layer 11, and laminating the porous metal layer 13 and the carrier layer 10, allowing the insulation layer 11 to be located between the carrier layer 10 and the first adhesive layer 12 and the first adhesive layer 12 to be located between the insulation layer 11 and the porous metal layer 13; and coating the conductive adhesive layer 14 on the surface of the porous metal layer 13, allowing the porous metal layer 13 to be located between the first adhesive layer 12 and the conductive adhesive layer 14.

In one embodiment, the method for preparing the porous metal layer 13 comprises: forming the aluminum layer on the thin film; performing the release treatment on the surface of the aluminum layer; plating the metal layer on the surface of the aluminum layer subjected to release treatment, wherein the plating method is one selected from sputtering, deposition, and water plating, and forming holes in the metal layer by the micro-etching treatment; and peeling off the film and the aluminum layer, allowing the metal layer to be a porous metal layer. In addition, a person having ordinary skills in the art can form voids (i.e., holes) in the metal layer through known micro-etching treatment processes, and can adjust the diameter of the formed voids according to needs and actual needs. Specifically, the voids formed by the micro-etching treatment are uniformly distributed in the metal layer structure, and the metal layer structure have higher shielding performance than the metal layer with through-holes. In addition, the porous metal layer has uniformly distributed micropores, but it may not have sufficient solder heat resistance and the problem of popcorn effect in the subsequent process cannot be avoided if the pores are only formed on the surface of the metal layer.

In one embodiment, the thin film is one of polyimide or ethylene terephthalate, and the metal layer is at least one selected from the group consisting of copper, aluminum, lead, nickel, cobalt, tin, silver, iron, or gold. Or, the metal layer is copper.

Figure 2:
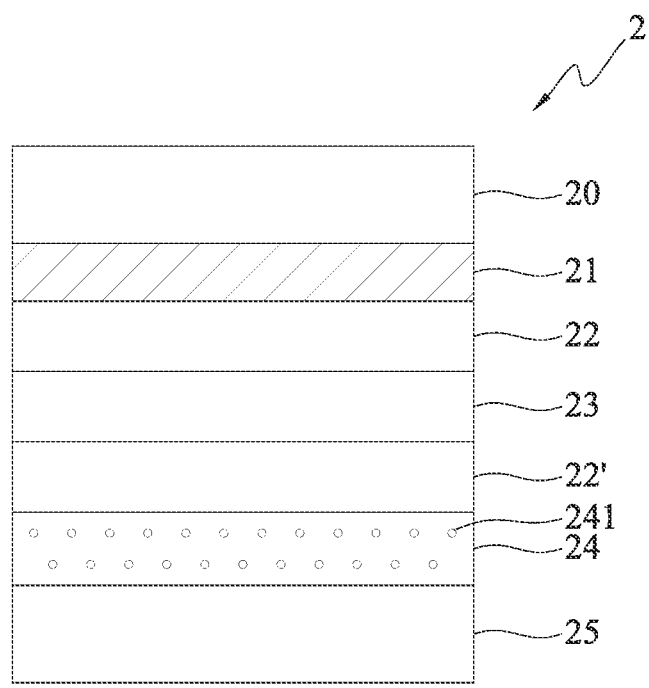
FIG. 2 is another schematic structural diagram of an EMI shielding film of the present invention.

Referring to FIG. 2, which shows an embodiment of the electromagnetic interference shielding film 2 with the carrier layer 20 of the present invention. The components are similar to the embodiment shown in FIG. 1, so the following descriptions are only according to the difference between FIGS. 2 and 1. The electromagnetic interference shielding film 2 shown in FIG. 2 further includes a second adhesive layer 22' located between the porous metal layer 23 and the conductive adhesive layer 24, wherein the porous metal layer 23 is located between the first adhesive layer 22 and the second adhesive layer 22', and the conductive adhesive layer 24 with a plurality of conductive particles 241 is located between the second adhesive layer 22' and the release layer 25. Specifically, the stacking of the electromagnetic interference shielding film 2 shown in FIG. 2 is the carrier layer 20, the insulation layer 21, the first adhesive layer 22, the porous metal layer 23, the second adhesive layer 22', the conductive adhesive layer 24 and the release layer 25 in order.

In one embodiment, the second adhesive layer 22' comprises at least one selected from the group consisting of epoxy resins, acrylic resin, phenol-formaldehyde resin, polyurethane, polyimide, and polyamide-imide.

In the embodiment of the electromagnetic interference shielding film 2 with the carrier layer 20 shown in FIG. 2, the preparation method is similar to the embodiment shown in FIG. 1, and the following descriptions are only according to the difference between FIGS. 2 and 1. Before coating the conductive adhesive layer 24, the second adhesive layer 22' is formed on the porous metal layer 23, then the conductive adhesive layer 24 is formed on the second adhesive layer 22', and the second adhesive layer 22' does not contain conductive particles 241.

The performance of the electromagnetic interference shielding film of the present invention is described below through examples and comparative examples.

Table 1 shows the test results of Examples 1 to 6 and Comparative Examples 1 to 3 with various layer thickness and various properties. Examples 1 to 6 were the electromagnetic interference shielding films of the present invention, and the structure shown in Examples 1 to 6 was the electromagnetic interference shielding film after peeling off the carrier layer, and Comparative Examples 1 to 3 were conventional shielding films.

In the manufacturing process of the electromagnetic interference shielding films shown in Examples 1 to 6, the carrier layer with a thickness of 25 microns was used, the main component of which was polyethylene terephthalate (PET), and carbon black was added in a content of 5% by weight based on the total weight of the carrier layer. The carrier layer had a surface roughness Rz of 0.00775 μm.

The insulation layers of Examples 1 to 6 were polyimide varnish layers with a pencil hardness of 4H, and Examples 1, 2, 5, and 6 had double-layer insulation layers (in the data shown in Table 1 below, the thickness of the insulation layers in Examples 1, 2, 5, and 6 was that after laminating the double-layer insulation layers). One of the double-layer insulation layers of Examples 1, 2, 5 and 6 had no inorganic additives added, and the carbon black with a content of 10% by weight was added as an inorganic additive in the other layer of the double-layer insulation layers based on the total weight of the single insulation layer. The insulation layer without inorganic additives was in contact with the first adhesive layer, and the other insulation layer was in contact with the carrier layer. The single-layer insulation layers of Examples 3 and 4 contained the carbon black as inorganic additives in an amount of 10% by weight based on the total weight of the single-layer insulation layers. The porous metal layers of Examples 1 to 6 were all copper foils with a porosity of 25±2%, a tensile strength of 22 kgf/mm$^2$, an elongation of 6%, and holes with a diameter of 1 to 20 microns. In Comparative Examples 1 to 3, the copper foil layers without micro-etching treatment were used, and the insulation layer of Comparative Example 1 is a polyurethane ink layer, and the insulation layers of Comparative Examples 2 and 3 are black polyimide film layers (Kapton®, DuPont™).

In addition, the first adhesive layers in Examples 1 to 6 and Comparative Examples 1 to 3 included polyimide, epoxy resin, phthalic anhydride as a curing agent and flame retardant. The content of the curing agent was 0.1% by weight of the polyimide, and based on the total weight of the first adhesive layer, the content of the epoxy resin was 2.4% by weight, and the flame retardant was 6.3% by weight. In addition, the conductive adhesive layers of Examples 1 to 6 were composite resins containing conductive particles, which were formed by mixing epoxy resin and acrylic resin in a weight ratio of 1:1, and the conductive particles were metal particles of nickel, silver and copper. Based on the total weight of the conductive adhesive layer, the content of each metal particle was 15% by weight. The structures of Examples 5 and 6 further included a second adhesive layer between the porous metal layer and the conductive adhesive layer, which was a composite resin containing epoxy resin and acrylic resin in a weight ratio of 1:1, so the thickness of the conductive adhesive layer shown in Table 1 was the total thickness of the second adhesive layer and the conductive adhesive layer.

The performance data shown in Table 1 and 2 are measured according to the following methods or standards:

Gloss: prepare a sample with a size larger than 3×8 (cm×cm), use a glossmeter to measure the gloss of the sample in the longitudinal direction, and read the value of the glossmeter at an angle of 60 degrees.

Resistance: prepare 30 mm×514 mm (longitude×horizontal) samples, and use the palm-type digital four-point probe to measure. Measure 2 groups along the horizontal direction of the sample, measure 3 groups along the longitudinal direction of the sample, and take the average of 6 sets of data.

Insulation resistance: measure at the semi-finished product stage that has not yet been plated with metal layer, cut the semi-finished product into size of 30×21 (cm×cm) (about A4 size), coat and laminate the electrolytic copper foil with a thickness of about 0.035 mm (about 1 OZ) on the semi-finished product, and obtain the sample after curing at 160° C. for about 1 hour. Use an ohmmeter to measure the left half, middle and right half of the insulation layer of the sample, and take the average of three sets of values.

Peel Strength: Measured according to IPC-TM-650 2.4.9 D.

EMI shielding performance: measured according to GB/T 30142-2013 "Measurement Methods for Shielding Effectiveness of Planar Electromagnetic Shielding Materials".

Solder Heat Resistance: Measured according to IPC-TM-650 2.4.13 D.

Simulated SMT process: The flexible printed circuit board was attached to the electromagnetic interference shielding film as a sample, and the sample was subjected to the simulated temperature change curve of the SMT process, ramping up to 150° C. at a rate of 2° C./sec, maintained at 150 to 190° C. for 120 seconds, then ramping up to 245±5° C. at a rate of 3° C./sec and maintained for 30 seconds, and finally, cooling to room temperature at a rate of 4±2° C./sec.

Surface roughness: measured by using an atomic force microscope (AFM) according to JIS-B0601.

Release Force: measured by using a tensile testing machine according to ASTM D3330.

TABLE 1

Layer thicknesses and properties of Examples 1 to 6 (E1-E6) and Comparative Examples 1 to 3 (CE1-CE3)

| | | E1 | E2 | E3 | E4 | E5 | E6 | CE1 | CE2 | CE3 |
|---|---|---|---|---|---|---|---|---|---|---|
| Thickness | Insulation layer | 3 | 3 | 5 | 5 | 3 | 3 | 10 | 12 | 5 |
| | First adhesive layer | 5 | 5 | 5 | 5 | 5 | 5 | 5 | 5 | 5 |
| | Metal layer | 3 | 5 | 3 | 5 | 3 | 5 | 1 | 7 | 3 |
| | Conductive adhesive layer | 5 | 5 | 5 | 5 | 7 | 7 | 5 | 5 | 5 |
| | Total | 16 | 18 | 18 | 20 | 18 | 20 | 21 | 29 | 18 |
| | Glossness (GU) | 13 | 13 | 16 | 16 | 13 | 13 | 29 | 37 | 111 |
| | Resistance (Ω) 70 mm spacing Aperture1.0 mm | 0.4 | 0.3 | 0.2 | 0.2 | 0.4 | 0.3 | 0.2 | 0.3 | 0.5 |
| | Insulation resistance > $10^{12}$ Ω | PASS | PASS | PASS | PASS | PASS | PASS | NG | PASS | PASS |
| | Peeling strength (kgf/cm) | 1.48 | 1.52 | 1.43 | 1.39 | 1.44 | 1.50 | 1.48 | 1.59 | 1.37 |
| | EMI shielding performance at 1 Ghz (dB) | 78 | 84 | 79 | 85 | 80 | 87 | 70 | 90 | 75 |

TABLE 1-continued

Layer thicknesses and properties of Examples 1 to 6 (E1-E6) and Comparative Examples 1 to 3 (CE1-CE3)

| | E1 | E2 | E3 | E4 | E5 | E6 | CE1 | CE2 | CE3 |
|---|---|---|---|---|---|---|---|---|---|
| EMI shielding at 1 GHz at 85° C. and 85% relative humidity after 100 hours (dB) | 73 | 81 | 76 | 81 | 75 | 81 | 61 | 85 | 70 |
| Solder heat resistance | 320° C. 60 sec | 320° C. 50 sec | 320° C. 40 sec | 320° C. 60 sec | 320° C. 60 sec | 320° C. 50 sec | 280° C. 30 sec | 240° C. 10 sec | 260° C. 10 sec |
| Simulated SMT process | PASS | PASS | PASS | PASS | PASS | PASS | PASS | NG | NG |

From the test results in the table 1, it can be seen that the electromagnetic interference shielding film of the present invention was superior to the current shielding film in the electromagnetic interference shielding performance, the simulation test of the SMT process, and the on-resistance and the weatherability after the SMT process.

Table 2 shows the influence of the content of inorganic additives on the properties of the insulation layer and the carrier layer according to Examples 7 to 20 and Comparative Example 4. The structures of Examples 7 to 20 and Comparative Example 4 were the carrier layer, the insulation layer, and the first adhesive layer in order without the metal layer and the conductive adhesive layer, and each of Examples 7 to 20 and Comparative Example 4 provided structures with two different compositions of inorganic additives. The insulation layers in Examples 7 to 20 and Comparative Example 4 were all single-layer polyimide varnish layers of 5 microns, the carrier layers were all polyethylene terephthalate of 25 microns, and the additives were shown in Table 2. The first adhesive layers of Examples 7 to 20 and Comparative Example 4 were the same as those used in Examples 1 to 6 and Comparative Examples 1 to 3. In addition, the pigments contained in the insulation layers and the carrier layers of Examples 7 to 20 and Comparative Example 4 were black pigment having 50% by weight of black iron oxides with, 15% by weight of acid black 220, 20% by weight of aniline black, 10% by weight of carbon black, and 5% by weight of titanium black, based on the total weight of the black pigment.

TABLE 2

Compositions of pigments and inorganic additives contained in the insulation layers and carrier layers of Examples 7 to 20 (E7-E20) and Comparative Example 4 (C4) and the test results of their surface roughness and release force.

| | Insulation layer | | Carrier layer | | Surface roughness Rz ($10^{-3}$ µm) | | Release force between the insulation layer and the carrier layer in the EMI shielding film after fast laminating (g/5 cm) |
|---|---|---|---|---|---|---|---|
| | Composition | Wt % | Composition | Wt % | Insulation layer | Carrier layer | |
| E7 | Carbon black | 5 | Carbon black | 0 | 9.7 | 4.95 | 164 |
| | Black pigment | 5 | Black pigment | 0 | 10.1 | 4.95 | 163 |
| E8 | Carbon black | 5 | Carbon black | 5 | 11.4 | 7.75 | 101 |
| | Black pigment | 5 | Black pigment | 5 | 10.8 | 7.73 | 94 |
| E9 | Carbon black | 5 | Carbon black | 10 | 14.7 | 11.89 | 71 |
| | Black pigment | 5 | Black pigment | 10 | 14.1 | 11.77 | 73 |
| E10 | Carbon black | 5 | Carbon black | 15 | 15.7 | 14.97 | 56 |
| | Black pigment | 5 | Black pigment | 15 | 15.1 | 14.91 | 55 |
| E11 | Carbon black | 10 | Carbon black | 0 | 13.4 | 4.95 | 154 |
| | Black pigment | 10 | Black pigment | 0 | 14.6 | 4.95 | 154 |
| E12 | Carbon black | 10 | Carbon black | 5 | 14.4 | 7.75 | 120 |
| | Black pigment | 10 | Black pigment | 5 | 15.2 | 7.73 | 121 |
| E13 | Carbon black | 10 | Carbon black | 15 | 18.4 | 14.97 | 73 |
| | Black pigment | 10 | Black pigment | 15 | 18.6 | 14.91 | 70 |
| E14 | Carbon black | 15 | Carbon black | 0 | 20.3 | 4.95 | 147 |
| | Black pigment | 15 | Black pigment | 0 | 18.5 | 4.95 | 149 |
| E15 | Carbon black | 15 | Carbon black | 5 | 24.3 | 7.75 | 117 |
| | Black pigment | 15 | Black pigment | 5 | 23.7 | 7.73 | 116 |
| E16 | Carbon black | 15 | Carbon black | 10 | 30.3 | 11.89 | 63 |
| | Black pigment | 15 | Black pigment | 10 | 28.5 | 11.77 | 60 |
| E17 | Carbon black | 15 | Carbon black | 15 | 36.3 | 14.97 | 16 |
| | Black pigment | 15 | Black pigment | 15 | 38.5 | 14.91 | 15 |
| E18 | Titanium dioxide | 5 | Titanium dioxide | 0 | 9.8 | 4.95 | 158 |
| | Titanium dioxide | 5 | Titanium dioxide | 3 | 10.2 | 7.60 | 144 |
| E19 | Titanium dioxide | 10 | Titanium dioxide | 0 | 19.2 | 4.95 | 155 |
| | Titanium dioxide | 15 | Titanium dioxide | 0 | 30.2 | 4.95 | 153 |
| E20 | Carbon black | 0 | Carbon black | 5 | 8.3 | 7.75 | 178 |
| | Black pigment | 0 | Black pigment | 51 | 8.6 | 7.73 | 178 |

TABLE 2-continued

Compositions of pigments and inorganic additives contained in the insulation
layers and carrier layers of Examples 7 to 20 (E7-E20) and Comparative Example 4
(C4) and the test results of their surface roughness and release force.

| | Insulation layer | | Carrier layer | | Surface roughness Rz ($10^{-3}$ μm) | | Release force between the insulation layer and the carrier layer in the EMI shielding film after fast laminating (g/5 cm) |
|---|---|---|---|---|---|---|---|
| | Composition | Wt % | Composition | Wt % | Insulation layer | Carrier layer | |
| CE4 | Carbon black | 0 | Carbon black | 0 | 7.6 | 4.95 | >500, unable to measure |
| | Black pigment | 0 | Black pigment | 0 | 7.6 | 4.95 | >500, unable to measure |

The test results in Table 2 confirm that by adjusting the type and/or content of the inorganic additives added, the surface roughness of the insulation layer and the carrier layer can be changed, thereby changing the release force between the carrier layer and the insulation layer. As shown in Comparative Example 4, the insulation layer and the carrier layer without any inorganic additives had excessive release force between the carrier layer and the insulation layer, resulting in failure to release smoothly, that is, an additional release agent should be added to separate the carrier layer from the EMI shielding film. In addition, since the insulation layer was contacted with and formed on the carrier layer, the surface roughness of the carrier layer affected the surface roughness of the insulation layer. Therefore, using a carrier layer with a higher surface roughness can bring about a better effect for the insulating layer roughening.

The above-mentioned embodiments are only illustrative and are not intended to limit the present invention. Any person skilled in the art can modify and change the above-mentioned embodiments without departing from the spirit and scope of the present invention. Therefore, the scope of the right protection of the present invention is defined by the scope of the claims attached to the present invention, as long as the effect and implementation purpose of the present invention are not affected, it should be included in the disclosed technical content.

What is claimed is:

1. An electromagnetic interference shielding film comprising:
    an insulation layer with pencil hardness of 2H to 6H, which includes a pigment, an inorganic additive, or a combination thereof;
    a first adhesive layer formed on the insulation layer;
    a porous metal layer having a plurality of micropores with a diameter of 1 to 120 microns, which is formed on the first adhesive layer, allowing the first adhesive layer to be located between the porous metal layer and the insulation layer, wherein a porosity of the porous metal layer is 15% to 30%, a tensile strength of the porous metal layer is equal to or greater than 20 kgf/mm², and an elongation of the porous metal layer is equal to or greater than 5%; and
    a conductive adhesive layer with a plurality of conductive particles, which is formed on the porous metal layer, allowing the porous metal layer to be located between the first adhesive layer and the conductive adhesive layer,
    wherein the insulation layer is a double-layer insulation layer, one layer of the double-layer insulation layers has no inorganic additive added, and the other layer of the double-layer insulation layers comprises the inorganic additive.

2. The electromagnetic interference shielding film according to claim 1, further comprises a carrier layer formed on the insulation layer, allowing the insulation layer to be located between the carrier layer and the first adhesive layer, wherein the carrier layer has a surface roughness Rz of 0.001 to 10 microns.

3. The electromagnetic interference shielding film according to claim 2, wherein the carrier layer includes at least one inorganic additive selected from the group consisting of calcium sulfate, carbon black, silicon dioxide, titanium dioxide, zinc sulfide, zirconium oxide, calcium carbonate, silicon carbide, boron nitride, aluminum oxide, talcum powder, aluminum nitride, glass powder, quartz powder and clay.

4. The electromagnetic interference shielding film according to claim 1, wherein the pigment includes an inorganic pigment, an organic pigment, or a combination thereof.

5. The electromagnetic interference shielding film according to claim 1, wherein the inorganic additive is at least one selected from the group consisting of calcium sulfate, carbon black, silicon dioxide, titanium dioxide, zinc sulfide, zirconium oxide, calcium carbonate, silicon carbide, boron nitride, aluminum oxide, talcum powder, aluminum nitride, glass powder, quartz powder and clay.

6. The electromagnetic interference shielding film according to claim 1, further comprises a second adhesive layer located between the porous metal layer and the conductive adhesive layer.

7. The electromagnetic interference shielding film according to claim 1, wherein the insulation layer includes polyimide resin.

8. The electromagnetic interference shielding film according to claim 2, wherein after the carrier layer being separated from the electromagnetic interference shielding film, the contact surface of the insulation layer in contact with the carrier layer has a gloss of 0 to 40 GU at a test angle of 60 degrees.

9. The electromagnetic interference shielding film according to claim 1, wherein the material for forming the porous metal layer is copper, aluminum, lead, nickel, cobalt, tin, silver, iron, or gold.

10. The electromagnetic interference shielding film according to claim 1, wherein the material of the conductive particles is at least one selected from the group consisting of copper, silver, nickel, tin, gold, palladium, aluminum, chromium, titanium, zinc, carbon, and alloys thereof.

11. The electromagnetic interference shielding film according to claim 1, wherein the thickness of the insulation layer is 3 to 10 microns, the thickness of the first adhesive layer is 3 to 20 microns, the thickness of the porous metal layer is 2 to 15 microns, and the thickness of the conductive adhesive layer is 3 to 25 microns.

* * * * *